United States Patent
Nalezinski et al.

(10) Patent No.: US 8,035,546 B2
(45) Date of Patent: Oct. 11, 2011

(54) METHOD FOR DETECTING AT LEAST ONE MOVING OBJECT

(75) Inventors: Martin Nalezinski, München (DE); Claus Seisenberger, Neufraunhofen (DE)

(73) Assignee: Siemens Aktiengesellschaft, Munich (DE)

( * ) Notice: Subject to any disclaimer, the term of this patent is extended or adjusted under 35 U.S.C. 154(b) by 352 days.

(21) Appl. No.: 12/373,447

(22) PCT Filed: Jul. 10, 2007

(86) PCT No.: PCT/EP2007/057010
§ 371 (c)(1), (2), (4) Date: Jan. 12, 2009

(87) PCT Pub. No.: WO2008/006817
PCT Pub. Date: Jan. 17, 2008

(65) Prior Publication Data
US 2010/0007545 A1    Jan. 14, 2010

(30) Foreign Application Priority Data
Jul. 13, 2006    (DE) .......................... 10 2006 032 544

(51) Int. Cl.
G01S 13/00    (2006.01)
G01S 13/08    (2006.01)
G01S 13/58    (2006.01)

(52) U.S. Cl. ................ 342/28; 342/27; 342/70; 342/89; 342/90; 342/94; 342/104; 342/109

(58) Field of Classification Search .................... 342/27, 342/28, 70–72, 89–97, 104–115
See application file for complete search history.

(56) References Cited

U.S. PATENT DOCUMENTS

| | | | | |
|---|---|---|---|---|
| 4,258,351 A * | 3/1981 | Shigeta et al. | ................. | 340/942 |
| 4,717,915 A * | 1/1988 | Goede | ............... | 342/66 |
| 4,866,438 A * | 9/1989 | Knisch | ........... | 340/936 |
| 5,008,678 A * | 4/1991 | Herman | ......... | 342/158 |
| 5,402,346 A * | 3/1995 | Lion et al. | ...... | 701/117 |
| 5,940,011 A * | 8/1999 | Agravante et al. | ........... | 340/903 |
| 6,018,308 A * | 1/2000 | Shirai | ............. | 342/70 |
| 6,111,523 A * | 8/2000 | Mee | ................ | 340/937 |
| 6,396,435 B1* | 5/2002 | Fleischhauer et al. | .......... | 342/70 |
| 6,577,269 B2* | 6/2003 | Woodington et al. | ......... | 342/196 |
| 6,696,978 B2* | 2/2004 | Trajkovic et al. | ............ | 340/936 |
| 7,227,474 B2* | 6/2007 | Zoratti et al. | ................ | 340/988 |
| 2003/0083818 A1* | 5/2003 | Tojima | ......... | 701/301 |
| 2004/0257266 A1* | 12/2004 | Pleva et al. | ..................... | 342/70 |
| 2005/0134440 A1* | 6/2005 | Breed | ........... | 340/435 |

FOREIGN PATENT DOCUMENTS

| | | |
|---|---|---|
| EP | 0188694 A2 | 7/1986 |
| WO | 2004063682 A2 | 7/2004 |

* cited by examiner

*Primary Examiner* — Thomas Tarcza
*Assistant Examiner* — Peter Bythrow
(74) *Attorney, Agent, or Firm* — Laurence A. Greenberg; Werner H. Stemer; Ralph E. Locher

(57) ABSTRACT

A method for the detection of at least one moving object in a pre-determined detection zone by way of a speed sensor. The method includes the following steps: determining a detection zone within an illumination region of the speed sensor; detecting a speed signal, particularly a Doppler signal, at least with the entry of a moving object into the illumination region; estimating an entry of the moving object into the detection zone on the basis of a speed of the object, and of a distance between a boundary of the illumination region and the detection zone.

15 Claims, 1 Drawing Sheet

METHOD FOR DETECTING AT LEAST ONE MOVING OBJECT

BACKGROUND OF THE INVENTION

Field of the Invention

The invention relates to a method for detecting at least one moving object, a device for detecting presence and a speed-dependent traffic display having a presence detector.

In presence detection, in particular in traffic engineering applications for detecting vehicle presence, distance and speed, radar sensors are used in addition to optical systems. For reasons of cost said sensors are often Doppler radars, i.e. what are termed continuous wave (CW) radars. In practice, in addition to the reflection amplitude, only a change in the reflection phase of the reflecting object or, as the case may be, scenario can be detected with said CW radars. Consequently, only the movement or, as the case may be, speed of an object can therefore be measured.

For many applications, e.g. for distance or speed monitoring, it is desirable to measure the speed of vehicles that are located within a certain distance range in proximity to the sensor. In certain situations it is additionally desired to detect only objects moving at a speed in a certain range. In this case it is frequently desirable for the limits to be set by means of software.

A known implementation consists in adjusting the sensor to a specific distance range by means of a mechanical adjustment. This does, though, mean that a maintenance engineer must gain access to the sensor for each reconfiguration of the detection zone. In the traffic environment, however, the sensors are frequently installed at a location that is difficult to access, e.g. on traffic light posts or signal gantries, as a result of which accessing the sensor constitutes a significant problem if the moving traffic must not be disrupted.

A further current implementation consists in measuring the distance of the object with the aid of what is termed a frequency-modulated continuous-wave (FMCW) radar. A disadvantage with this solution is that an FMCW radar is more expensive than a Doppler radar, since a tunable, regulated signal source is required for the FMCW concept, whereas an unregulated fixed-frequency signal source suffices in the case of the Doppler concept.

Furthermore, the radar sensor operating according to the FMCW principle supplies an overlaying of the distance signal and the speed (Doppler) signal. In this case it can happen, for example, that the FMCW-Doppler frequency is negative due to the direction of movement of the measurement object and the FMCW distance frequency is positive and smaller in terms of absolute amount. The overlaid signal then comes to lie in the negative frequency range. Separating the two signals necessitates complex signal processing which is in turn reflected in high hardware costs.

A simplified implementation according to the FMCW principle consists in performing a speed measurement and distance measurement in alternation. However, this method only works when only one vehicle is located within the detection zone. As soon as a plurality of vehicles are located in the measurement range, assigning measured speeds and distances correctly is scarcely practicable.

BRIEF SUMMARY OF THE INVENTION

It is the object of the present invention to provide a simple, robust and economical means of presence detection even when a plurality of vehicles are present in a detection zone.

This object is achieved by means of a method as claimed in claim 1, a presence detector as claimed in claim 8, and a speed-dependent traffic display as claimed in claim 10.

The method for detecting at least one moving object in a predetermined detection zone by means of a speed sensor has at least the following steps:

specifying a detection zone within an illumination zone of the speed sensor;

measuring a speed signal, in particular a Doppler signal, at least upon entry of a moving object into the illumination zone;

estimating an entry of the moving object into the detection zone on the basis of a measured or actual speed of the object and a distance between the illumination zone and the detection zone.

The method can be performed using a robust, low-cost sensor, e.g. a Doppler radar, or else an FMCW radar.

Furthermore, the length of the detection zone can be selected independently of the aperture angle of the antenna (which, among other things, determines the illumination zone), wherein both the start and the end of the detection zone can be chosen largely freely within the illumination zone. This can happen particularly favorably by means of a purely electronic setting of the sensor. The detection zone can thus also be chosen largely independently of the installation position of the detector.

A method is preferred wherein the step of specifying the detection zone includes a specifying of a detection zone as a function of a speed of the object. The detection zone can thus be changed dynamically with the object, in particular vehicle, speed. In this way it is possible e.g. to define the detection zone, not locally, but as a function of time. With the method described it is possible for example to initiate the detection e.g. 5 seconds before a marker line is reached and to cancel the detection again 1 second before said line is reached.

A method is furthermore preferred wherein the distance between the illumination zone and the detection zone is reduced when the object is moving at a higher speed. This is advantageous in particular for a speed-dependent display of warning information in order to allow drivers a sufficiently long visualization at high speeds also.

Also preferred is a method which additionally has a step entailing a reduction, in particular an essentially complete elimination, of an angle dependence of the measured speed of the object.

Preferred in addition is a method wherein the measured speed of the object is calibrated using a geometry function, in particular using a geometry function stored point by point in a lookup table. With knowledge of the sensor position and the object position, the geometry function can be calculated for example using a triangulation method. In particular the geometry function includes information about an angle between the axis that runs from the speed sensor to the object, and the direction of the speed vector.

In one embodiment, the speed needs to be determined only once upon entry into the illumination zone and then assumed as constant. For more accurate determination of the object position it is preferred if the speed of the object is also determined in the illumination zone, in particular continually recalculated. 'Continually' in this context is also understood to mean e.g. a recalculation at regular intervals.

The method is preferably provided for use in a display of warning information that is dependent on the speed of the object to occupants of the object/vehicle.

For the purpose of detecting at least one moving object in a predetermined detection zone, the presence detector has the following:

a speed sensor for measuring a speed signal at least upon entry of a moving object into an illumination zone of the speed sensor, a control unit for specifying a detection zone within an illumination zone of the speed sensor, and an evaluation unit for estimating an entry of the moving object into the detection zone on the basis of a measured speed (Vr) of the object and a distance between the illumination zone and the detection zone.

The speed sensor preferably includes a Doppler radar, in particular an FMCW radar.

The speed-dependent traffic display is equipped with a presence detector of said kind.

The invention is described in more detail below schematically with reference to an exemplary embodiment.

DESCRIPTION OF THE INVENTION

Figure 1:
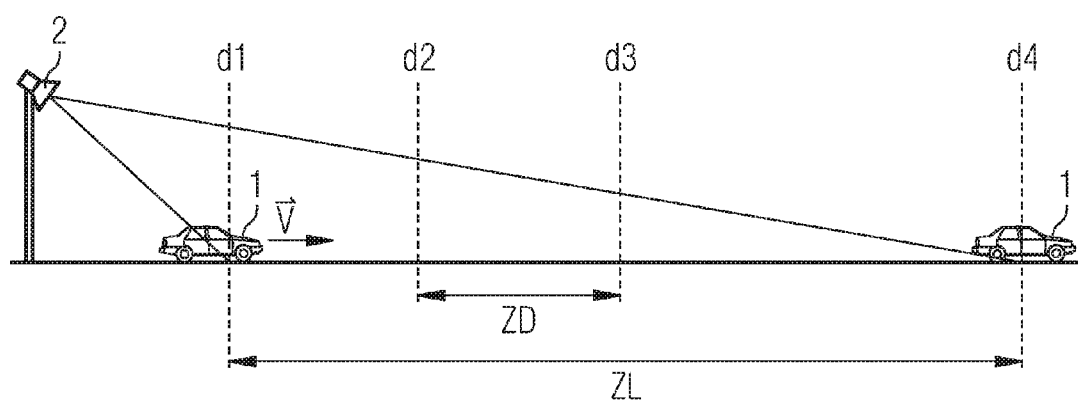
FIG. 1 shows a schematic of a layout of a device for detecting the presence of objects in a detection zone of a sensor in a side view.

FIG. 1 shows a device for detecting the presence of vehicle objects 1 which comprises a Doppler-capable speed sensor 2 that is installed at an elevated position. Because the antenna characteristic of the speed sensor 1 is known, a front boundary d1 and a rear boundary d4 of a zone ZL illuminated by the speed sensor 2 are known. In the case of a circular antenna beam characteristic and inclined sensor 2, the shape of the illumination zone ZL is generally oval.

The boundaries d1, d4 within which vehicles 1 can be detected are relatively sharply delimited. Thus, as soon as a Doppler frequency becomes measurable by the speed sensor 1, this means that an object (vehicle) 1 is entering the illumination zone ZL at d1 or d4 and that its speed v can be measured. As soon as the Doppler signal disappears again, the vehicle 1 has reached the corresponding second boundary d4 or d1 of the illumination zone ZL and exits the zone again. Since the speed v of the measurement object 1 is known at any time, the current position of the vehicle 1 can be calculated from the time of entry into the illuminated zone ZL, the speed v and the time that has elapsed since entry. The more sharply the illumination zone ZL is delimited, the more precisely the position of the vehicle 2 upon entry into the illumination zone ZL can be determined.

In this embodiment a detection zone or gate ZD located in the illumination zone ZL is additionally set at the speed sensor 1. The detection zone is set e.g. electronically on the speed sensor 1 between the boundaries d2 and d3.

The reaching of the boundary d2 of the detection zone ZD coming from d1 is calculated (given an approximately linear path of the vehicle 1) as $$d2 = d1 + V \cdot t,$$

where V is the speed of the vehicle 1 and t the elapsed time. In this case the calculation can be based for example on a comparison of an actual position dF of the vehicle 1 with d2, or on a time comparison between an elapsed time tF since entry into the illumination zone ZL and the time $t=(d2-d1)/V$ required to reach the detection zone ZD.

It follows from FIG. 1 that the speed Vr measured by the sensor 2 as the vehicle 1 travels at a constant speed V through the illuminated zone ZL varies as a function of the local angle between the line of sight of the sensor 2 to the vehicle 1 and the direction of travel of the vehicle 1. For practical applications this angle dependence is often sufficiently small for a measurement error to be sufficiently small; it is then possible to set V=Vr without major restriction.

Figure 2:
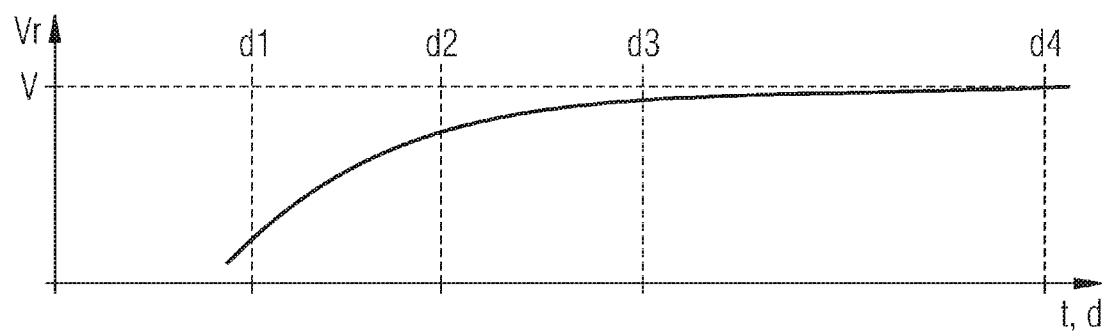
FIG. 2 shows a plotting of a speed of an object measured by the sensor from FIG. 1 as a function of an angle between the object-sensor line of sight and a speed sensor assigned to the object.

Alternatively the angle dependence of the measured speed Vr or the difference of the measured speed Vr versus the actual vehicle speed V can be corrected out. In FIG. 2, the measured speed Vr at an actually constant speed V of the vehicle 1 is plotted over the time period t or the distance d from the boundary d1 since reaching the illumination zone ZL at d1. The plotting K shown in FIG. 2 can be determined once for example and then used—point by point if necessary—as a calibration curve for speed correction.

If a plurality of vehicles 1 are located in the illumination zone ZL between d1 and d4, they are not to be differentiated only if they have the same speed V or Vr. Otherwise a plurality of Doppler frequencies arise which can be tracked separately. In the former case, however, it is usually immaterial that the vehicles 1 can no longer be differentiated because in that case one vehicle 1 is always located in the detection zone.

The invention claimed is:

1. A method for detecting at least one moving object in a predetermined detection zone, the method which comprises:
providing a speed sensor and specifying a detection zone within an illumination zone of the speed sensor;
measuring a speed signal at least upon an entry of a moving object into the illumination zone;
estimating an entry of the moving object into the detection zone on the basis of a speed of the object and a distance between a boundary of the illumination zone and the detection zone.

2. The method according to claim 1, wherein the speed signal is a Doppler signal.

3. The method according to claim 1, wherein the step of specifying the detection zone comprises specifying the detection zone as a function of a speed of the object.

4. The method according to claim 1, which comprises, at a higher speed of the object, reducing a distance between the boundary of the illumination zone and the detection zone.

5. The method according to claim 1, which further comprises reducing an angle dependence of the measured speed of the object.

6. The method according to claim 5, which comprises calibrating the measured speed of the object using a geometry function.

7. The method according to claim 6, which comprises using a geometry function stored point by point in a lookup table.

8. The method according to claim 1, which comprises continually recalculating the speed of the object.

9. The method according to claim 1, which comprises selectively using a result in a display of warning information that is dependent on the speed of the object to occupants of the object.

10. A presence detector for detecting at least one moving object in a predetermined detection zone, comprising:
a speed sensor for measuring a speed signal at least upon an entry of a moving object into an illumination zone of said speed sensor;
a control unit for specifying a detection zone within the illumination zone of said speed sensor; and
an evaluation unit connected to said speed sensor for estimating an entry of the moving object into the detection zone based on a speed of the object and a distance between a boundary of the illumination zone and the detection zone.

11. The presence detector according to claim 10, wherein said speed sensor includes a Doppler radar.

12. The presence detector according to claim 11, wherein said Doppler radar is an FMCW radar.

13. A configuration comprising:
a speed-dependent traffic display, said speed-dependent traffic display including a presence detector according to claim 10.

14. The method according to claim 1, wherein the step of specifying the detection zone within the illumination zone of the speed sensor includes changing the distance between the illumination zone and the detection zone dependent on a speed of the object.

15. The presence detector according to claim 10, wherein said control unit changes a distance between the illumination zone and the detection zone dependent on a speed of the object.

* * * * *